United States Patent [19]

Bobeck

[11] 4,162,537

[45] Jul. 24, 1979

[54] MAGNETIC BUBBLE MEMORY

[75] Inventor: Andrew H. Bobeck, Chatham, N.J.

[73] Assignee: Bell Telephone Laboratories, Incorporated, Murray Hill, N.J.

[21] Appl. No.: 914,959

[22] Filed: Jun. 12, 1978

[51] Int. Cl.² .......................................... G11C 19/08
[52] U.S. Cl. ...................................... 365/19; 365/37
[58] Field of Search ............................ 365/19, 20, 37

[56] References Cited

U.S. PATENT DOCUMENTS 3,925,768 12/1975 Lin ............................................. 365/37
3,988,722 10/1976 Keefe et al. ............................... 365/34

OTHER PUBLICATIONS

AIP Conference Proceedings on Magnetism & Magnetic Materials, No. 24, 1974, pp. 550–551.

Primary Examiner—James W. Moffitt
Attorney, Agent, or Firm—Herbert M. Shapiro

[57] ABSTRACT

A high speed magnetic bubble memory is realized with two like-apertured metallic layers each adapted for substantially uniform overall current flow. The apertures locally modify the current flow to provide localized field gradients for moving bubbles in an adjacent bubble layer. The patterns of apertures in the two layers are offset with respect to one another and the layers are pulsed in sequence in a manner to move bubbles along propagation paths defined by the patterns of apertures.

8 Claims, 17 Drawing Figures

3 IN

ANY 2

ANY 1

MAGNETIC BUBBLE MEMORY

BACKGROUND OF THE INVENTION

Magnetic bubble memories are now well known in the art. One mode of moving bubbles employs electrical conductors and is described in A. H. Bobeck et al, U.S. Pat. No. 3,460,116 issued Aug. 5, 1969. Another mode for moving magnetic bubbles is known as the "field-access" mode. This mode employs a patten of elements, typically magnetically soft permalloy, responsive to a magnetic field reorienting in the plane of bubble movement for generating changing patterns of field gradients to move bubbles. The field-access mode is disclosed in A. H. Bobeck, U.S. Pat. No. 3,534,347, issued Oct. 13, 1970.

Recently, a new type of bubble memory has been disclosed in which an apertured electrically-conducting layer is adapted for substantially uniform overall current flow thereacross. The apertures cause localized perturbation in the current flow resulting in a pattern of field gradients for moving bubbles. The apertures are arranged in positions offset from rest positions to which bubbles move when the current-produced field gradients cease. Thus, a two-phase operation results in unidirectional bubble movement. Bubble memories of this type are disclosed in A. H. Bobeck, patent applications Ser. Nos. 857,921 and 857,925, filed Dec. 6, 1977.

Memories of this recent type are characterized by two problems. One is the alignment of the rest positions and the apertures in the conducting layer. The rest positions are typically defined by ion-implantation and the resulting regions have to be aligned to within one-eighth period of the propagation pattern. For present industrially available photolithographic techniques, one micron line widths are achievable leading to propagate periods of eight microns. Smaller periods, of course, are desirable.

Another problem with these memories is that movement of a bubble to a rest position occurs at a slower speed than movement from a rest position. The reason for this is that one can overdrive with high amplitude drive pulses to move a bubble from a rest position. But there is a trade-off in the movement to the rest position. For example, if the energy difference between the offset position and the rest position is too high, the drive pulses have to be increased to compensate. This leads to higher power requirements. On the other hand, if the energy difference is low, the drive on the bubble causes relatively slow movement to the rest position.

BRIEF DESCRIPTION OF THE INVENTION

The solutions to the foregoing problems are realized in a magnetic bubble memory which employs two apertured, electrically-conducting layers for moving bubbles in an adjacent magnetic bubble layer. The layers have patterns of apertures which are disposed in positions offset from one another with a layer of insulating material separating them. Each of the electrically-conducting layers is adapted to have substantially uniform overall current flow impressed thereacross in response to current pulses. A current pulse sequence of +, +, −, −, is impressed in the two layers alternately. Because movement in any instance is in response to a pulse, the bubble may be subjected to an arbitrarily high overdrive in each instance. Further, misalignment of the apertures in the two layers of up to one quarter of the propagation period is acceptable. Thus, for presently achievable line widths of one micron, four micron circuits are achievable. At eight micron periods, quarter million bit bubble chips are achievable with chips nominally two hundred and fifty mils on a side. For four micron periods, one million bit chips are realizable in the same area.

The invention thus is directed at a magnetic bubble memory including a layer of material in which magnetic bubbles can be moved and electrically-conducting means for moving bubbles in the layer in response to currents impressed therein. The memory is characterized in that the conducting means comprises substantially uniform first and second electrically-conducting layers electrically isolated from one another and means for impressing substantially uniform overall current flow in the conducting layers. Each of the conducting layers includes a pattern of apertures adapted to modify the impressed current flow in a manner to generate changing patterns of localized magnetic field gradients in the bubble layer for moving bubbles along a path in that layer.

DETAILED DESCRIPTION OF ILLUSTRATIVE EMBODIMENTS

Figure 1:
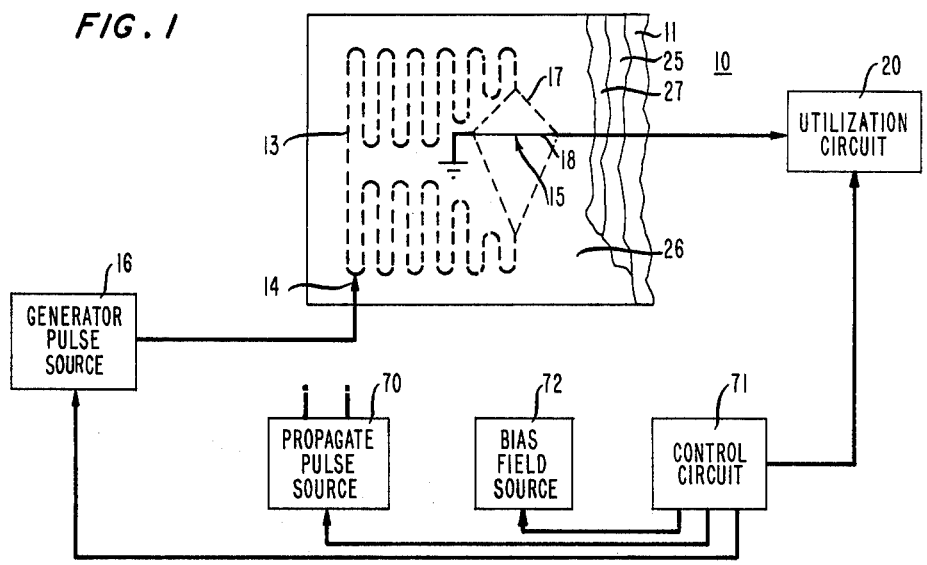
FIG. 1 is a schematic representation of a magnetic bubble memory in accordance with this invention.
Figure 2:
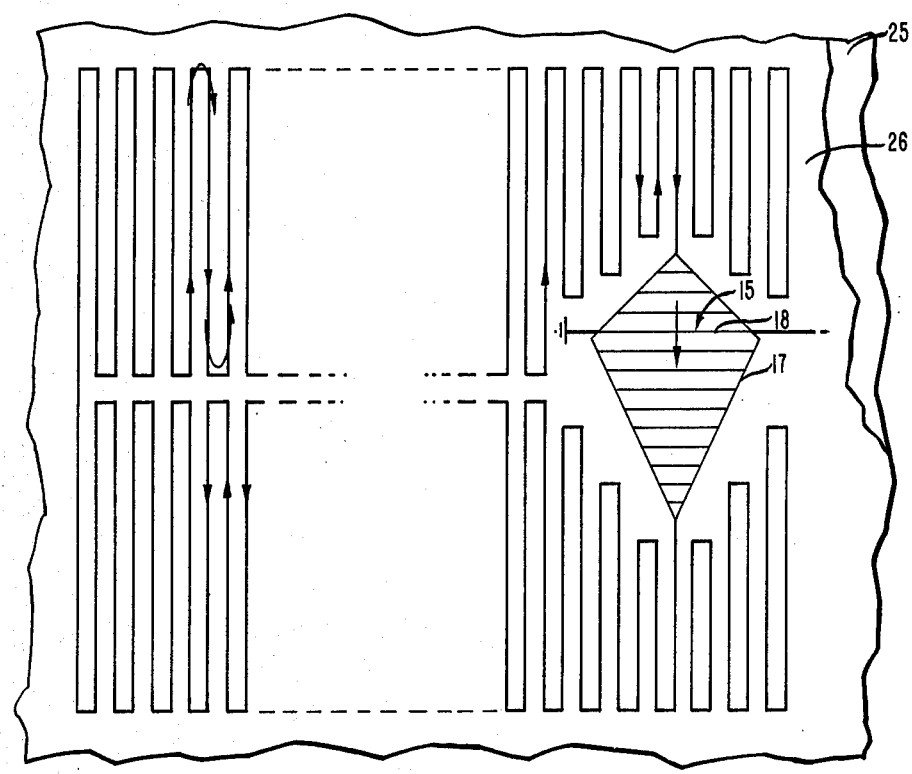
FIGS. 2, 6, 7, and 8 are schematic top views of portions of the memory of FIG. 1.

FIGS. 1 and 2 show a magnetic bubble memory 10 including a layer of material 11 in which magnetic bubbles can be moved. Layer 11 typically comprises an epitaxially grown single crystal film on a single crystal, nonmagnetic garnet substrate. Alternatively, amorphous materials on a glass substrate have been proposed for bubble memories.

Figure 4:
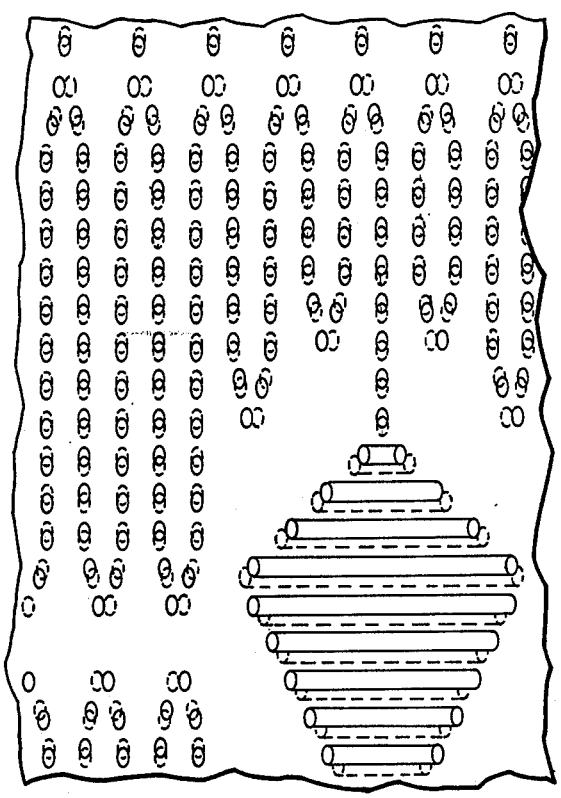
FIGS. 3 and 4 are enlarged top views of portions of the memory of FIG. 1.
Figure 3:
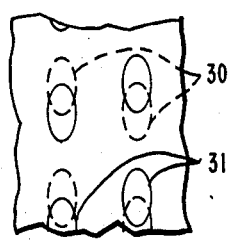

A serpentine path for magnetic bubbles is represented by line 13 in FIG. 1 and shown in greater detail in FIGS. 2, 3 and 4. Bubbles introduced at 14 are detected at 15 in an illustrative test circuit. The bubbles are introduced at 14 by a bubble generator pulsed in a well understood manner by a generate pulse source represented by block 16 in FIG. 1. An expander-detector, represented by the diamond-shaped area 17, operates to expand bubbles as they move to a detector 18. The detector applies a signal to a utilization circuit represented by block 20 in FIG. 1.

Path 13 along which bubbles propagate in layer 11 is defined by a unique propagation structure. That structure comprises first and second layers 25 and 26 of electrically-conducting material. The layers are separated by an electrically-insulating layer 27. Each layer of electrically-conducting material includes a pattern of apertures which may comprise recesses in the layer or which may penetrate the layer completely. In experimental circuits the apertures penetrate the layer. Rectangular, oval, circular, square, . . ., etc., shaped apertures are suitable. Oval apertures are described illustratively herein.

FIGS. 3 and 4 show portions of layers 25 and 26 including (broken) ovals 30 and ovals 31 in the layers respectively. Propagation paths for bubbles are defined by the aperture patterns in the two layers 25 and 26 arranged so that the patterns are offset as shown.

Figure 6:
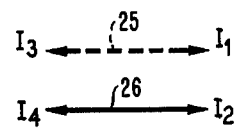
Figure 5:
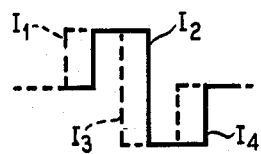
FIGS. 5 and 11 are pulse diagrams of the operation of the memory of FIG. 1.

Bipolar pulses, $I_1$ and $I_3$, and $I_2$ and $I_4$, as shown in FIG. 5, are applied to layers 25 and 26, respectively, in an overlapping fashion (i.e., viz: sine and cosine wave). In response, substantially uniform overall current flow is impressed in first and second directions along an axis in each of layers 25 and 26 as indicated by the double headed arrows in FIG. 6. Note that broken line, arrow, or oval indications relate to layer 25.

Figure 7:
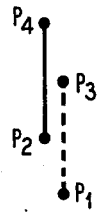

We will make the assumption that current flow is initiated in layer 25 first and designate the succession of bubble positions for the pulse form of FIG. 5. Illustratively, four positions are occupied in each period (i.e., pair of offset apertures) of the aperture pattern in response to a single cycle of overlapping pulse forms as shown in FIG. 5. FIG. 7 shows the four positions for a period designated P1, P2, P3, and P4. The solid and broken lines are shown displaced to the side of one another only for illustrative purposes, the solid line indicating positions relative to an aperture in layer 26. The broken line, once again, corresponds to layer 25 showing positions relative to apertures in that layer.

Figure 8:
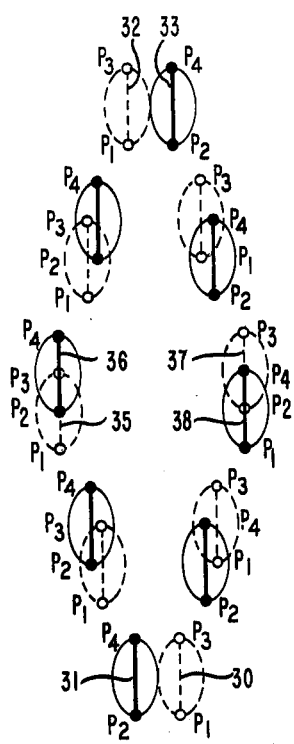

An inspection of FIGS. 1 and 2 indicates that turns and closed loop paths as well as straight line paths are realizable merely by proper placement of the apertures in layers 25 and 26. FIG. 8 shows an enlarged view of a succession of positions for a closed loop, of course with turns. The positions for each period are again denoted as P1, P2, P3, and P4. Note that the apertures represented by lines 30 and 31 and 32 and 33, in FIG. 8, are placed beside one another and those represented by lines 35 and 36 and 37 and 38 are aligned with the axis of bubble propagation but offset with respect to one another along that axis. Each of the remaining apertures is both offset and displaced laterally with respect to the associated aperture. The bubble follows the generally oval path defined by the succession of positions noted in FIG. 8. As can be seen, bubble movement is in a clockwise direction. But a reversal of the pulse sequence can produce counterclockwise movement.

Also, it should be clear that the placement of an aperture with respect to its associate aperture in the adjacent electrically-conducting layer determines the succession of field gradients and thus the precise bubble movement in each instance. The relative placement can be such that a pair of apertures may be offset with respect to one another along the axis of bubble movement, displaced laterally with respect to one another, or both.

Figure 9:
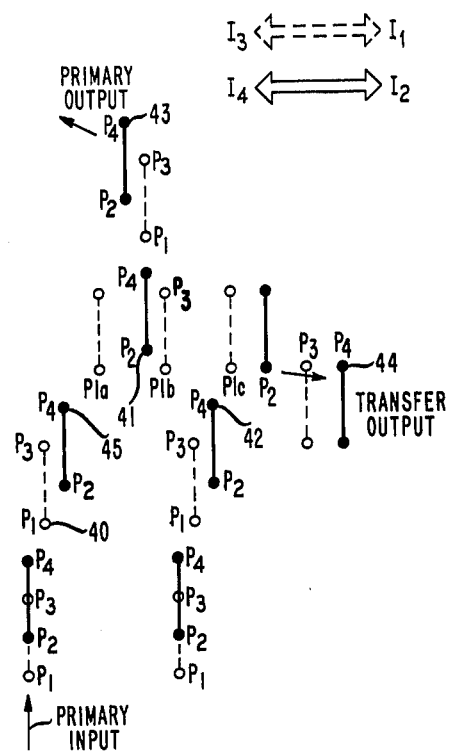
FIGS. 9, 10, 14, 15, 16, and 17 are schematic representations of alternative top views of portions of memories of the type shown in FIG. 1.

FIG. 9 shows an arrangement of aperture patterns which permits a transfer operation from say, a closed loop of the type shown in FIG. 8. The normal propagation pulse sequence takes a bubble starting at position 40 to the succession of positions—1234$1a$2341234—ending at position 43. In this connection, a pulse sequence is designated as are the corresponding bubble positions, but without the P. Thus, a pulse for moving a bubble to a position P1 is designated by -1-. A "transfer out" operation for a bubble starting at position 40 in FIG. 9, requires a sequence of current pulses—1234$1a$2$1b$4$1c$2-34—for moving the bubble to position 44. A bubble in this instance moves from position 40 to position 41 to position 42 to position 44. Note that position P1$b$ is nearer to 41 than to P1$a$ so that the pulse sequence 214 results in the bubble moving from position 41 to P1$b$ to 42 rather than from 41 to P1$a$ to 45. For a similar reason, the pulse sequence 21412 results in the bubble moving from 42 to P1$c$ rather than to P1$b$. Thus, the insertion of the pulse sequence 1412 results in a bubble transfer to exit position 44 rather than to position 43. Such a pulse sequence is easy to achieve as would be apparent to one skilled in the art and is discussed in greater detail hereinafter.

Figure 10:
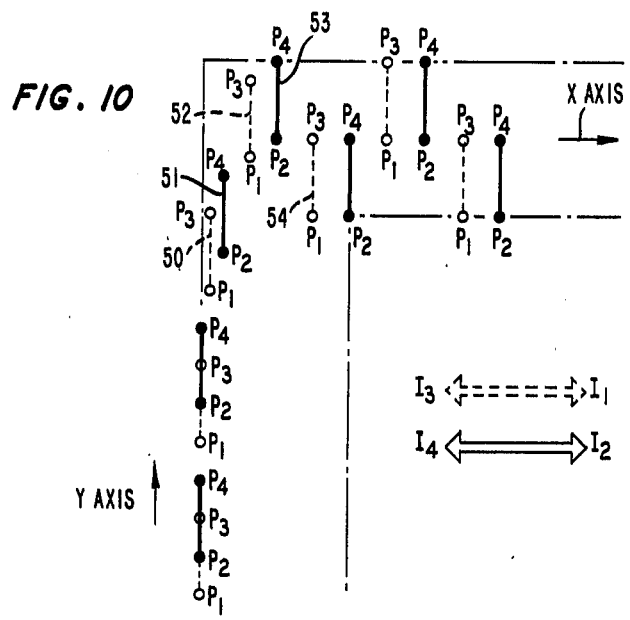

FIG. 10 illustrates patterns of apertures arranged to permit even further flexibility of bubble movement. Specifically, the patterns produce simultaneous x and y axis movement of bubbles as well as a ninety degree turn. In response to the regular pulse sequence of FIG. 5, bubbles move from bottom to top along a y axis and left to right along an x axis in FIG. 10, as viewed, simultaneously, following the usual position sequence P1, P2, P3, and P4. The lines 50, 51, 52, 53, and 54 can be seen to define a position sequence which moves a bubble through a ninety degree turn.

The propagate pulse sequences of FIG. 5 are produced by a source similar to that disclosed in copending applications, Ser. Nos. 857,921 and 857,925 filed Dec. 6, 1977 for A. H. Bobeck. Block 70 in FIG. 1 represents such a source for producing such pulses for the layers. Source 70 is operative under the control of a control circuit represented by block 71 in FIG. 1. Such a control circuit is adapted in accordance with well understood principles to alter the pulse sequence to produce a transfer operation as described hereinabove.

A bias field source for maintaining bubbles herein at a nominal operating diameter is represented by block 72 of FIG. 1.

Figure 11:
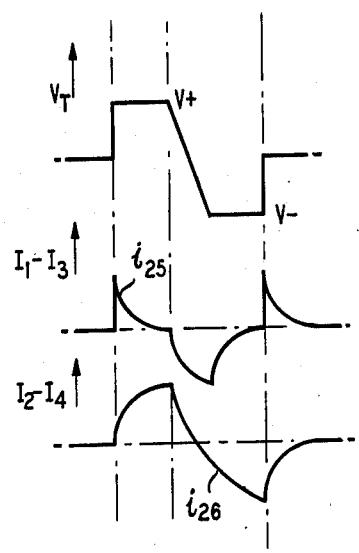
Figure 12:
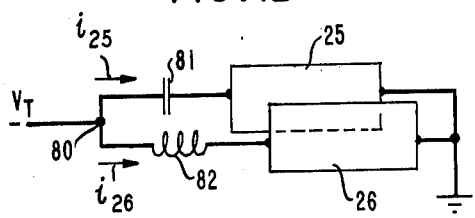
FIGS. 12 and 13 are schematic representations of portions of a practical arrangement for the memory of FIG. 1.

Source 70 of propagate pulses may comprise a square wave voltage drive which provides current waveforms of the type shown in FIG. 11. The voltage waveform ($V_T$) is provided at point 80 in FIG. 12. As can be seen in FIG. 12, layers 25 and 26 are electrically in parallel with each other, but in series with a capacitance 81 and an inductance 82, respectively. The arrangement is operative to switch energy between the inductance and capacitance in a manner to impress essentially the waveform of FIG. 5 in layers 25 and 26 in the requisite manner to produce bubble propagation.

Figure 13:
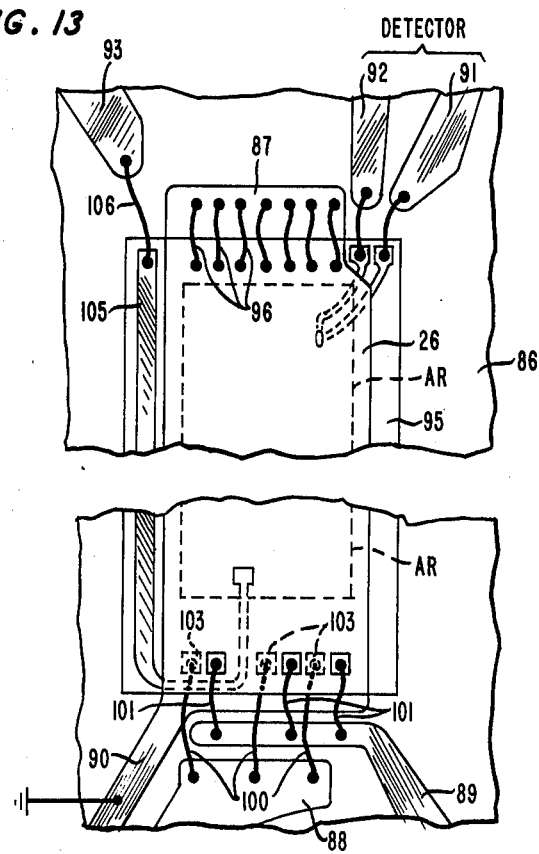

It is important that substantially uniform overall current flow be established in each of layers 25 and 26. FIG. 13 shows an enlarged top view of a practical arrangement for impressing the currents. FIG. 13 shows a fiber board 86 with an electrically-conducting coating 87. Coating 87 is grounded as indicated at the bottom of FIG. 13 as viewed. Coating 87 is divided into electrically-conducting lands 88, 89, 90, 91, 92, and 93 defined therein, adapted as lands for external electrical connection. A magnetic bubble memory chip 95 is placed on the board with layers 25 and 26 upward. An active area AR 200 by 600 periods includes a 100,000 bit memory with periods of 8 microns. Multiple connections are made between conducting coating 87 and conducting layers 25 and 26 via connection 96; (layers 25 and 26 are processed in contact at the upper edge of the chip). Electrical connections to the propagate driver is made to layers 25 and 26 via lands 88 and 89 and connection 100 and 101, respectively. Note that connections to layer 25 are via lands represented by broken block designation 103, broken to show that they are subterranean. Lands 91 and 92 interconnect a, typically, permalloy magnetoresistance detector strip in the expander-detector portion of the path of the expanded bubble. External connection is made to utilization circuit 20 and to control circuit 71 of FIG. 1, the latter of which applies interrogate pulses to the detector.

Land 93 is connected to source 16 of FIG. 1. Internal electrical connection to a bubble generator and annihilator at position 14 of FIG. 1 is made via conductor 106 between land 93 and land 105. Land 105 is electrically part of layer 25. The structure and operation of a generator-annihilator particularly adapted to a magnetic bubble memory of the type here described is disclosed in copending patent application (Case 125) Ser. No. 914,960 filed for the inventor of the present invention on June. 12, 1978.

In one illustrative embodiment a magnetic bubble memory of the type shown in FIGS. 1 and 2 was formed using a magnetic layer of YSmCaGe garnet, 1.7 microns thick. The layer was grown epitaxially on a substrate of single crystal, non-magnetic Gadolinium Gallium Garnet. An electrically-conducting layer of Al(96)Cu(4) was formed on the surface of the garnet layer. The conducting layer (25) had a thickness of 0.25 microns. A layer of $SiO_2$, 0.15 microns thick, was deposited on the first conducting layer and a second conducting layer (26) was deposited over the oxide. The second conducting layer was 0.38 microns thick and had a composition like that of layer 25. Oval apertures 4 microns by 3 microns were formed by photoetching techniques, the apertures in the first layer being formed prior to the deposition of the $SiO_2$ layer. The propagate source provided current pulses at a density of 2 milliamperes per micron of sheet conductor width without a zero current separation between the pulses. Operation as high as 1 megaherz has been achieved.

An expander-detector employing slots of successively increasing length astride the bubble path expanded bubbles from a nominal diameter of 1.7 microns to a strip domain 30 microns long. A thin film (300 Å) magnetoresistive detector illustratively, beneath the first conducting layer and insulated therefrom, exhibited an output of 2 millivolts. An overall arrangement as shown in FIG. 13 was employed. An active area (AR of FIG. 13) included 100,000 bits.

Figure 14:
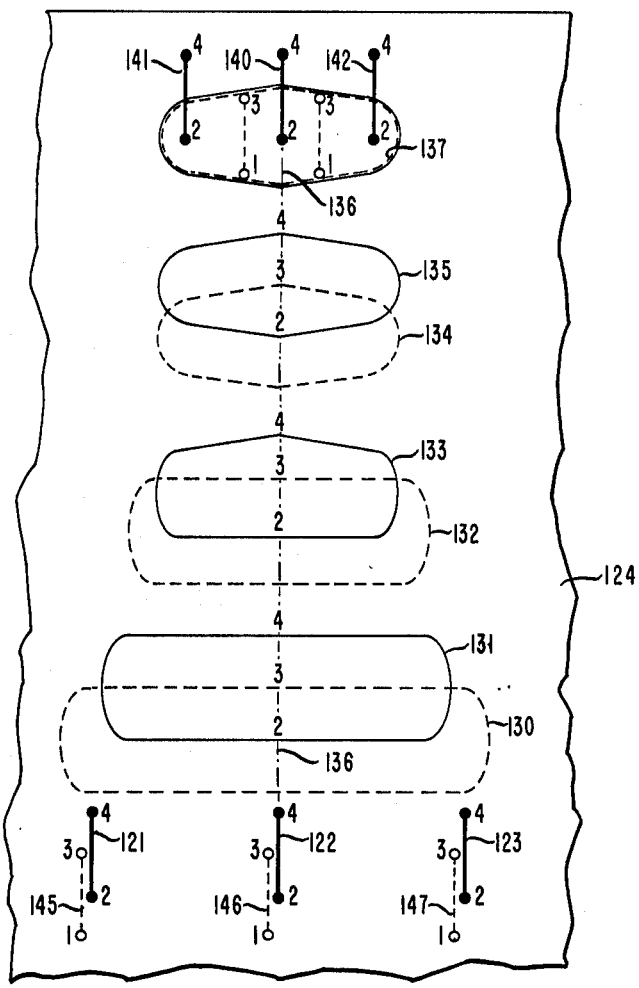

FIG. 14 shows a schematic top view of a bubble interactor of the type first shown in the June 1971 issue of *Scientific American* at page 89. FIG. 14 shows channels 121, 122, and 123, defined by apertures in a conducting layer 124, which are operative to move a pattern of bubbles to apertures 130 and 131 each of which has a lateral extent corresponding to the three channels. Any bubble advanced along one of the channels moves under the influence of broad field gradients generated at 130 and 131. Apertures 132 and 133, and 134 and 135 are shaped so that if only a single bubble is advanced along the three channels during a particular cycle of operation, that bubble is urged toward axis 136 as it advances. Since this type of propagation implementation does not use a cooperative set of discrete propagate elements (viz: chevrons), the granularity usually associated with lateral motion of a bubble, as it seeks the central axis, is absent. That bubble is ultimately moved by fields at aperture 137 for movement during pulses 2, 3, and 4 to a position 140.

Figure 15:
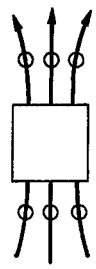
Figure 16:
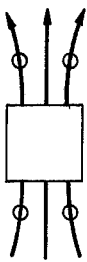
Figure 17:
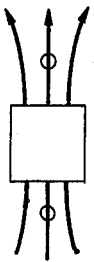

On the other hand, the presence of two bubbles from channels 121, 122 or 123 during a particular cycle results in both bubbles being prevented from reaching position 140 because of repulsion forces between bubbles. Consequently, in this instance bubbles ultimately appear at positions 141 and 142. FIGS. 15, 16, and 17 represent the various functions for bubbles in all three channels, bubbles in any two channels, and a bubble in any one channel, respectively.

Note that in FIG. 14 apertures 130, 132, 134, 137, 145, 146, and 147 are formed in a conducting layer beneath that in which all the remaining apertures are formed. Also, the preservation of bubbles as they move beneath enlarged apertures 130 through 137 depends on the bias field range. Aperture 130 causes a laterally enlarged magnetic field gradient to be generated in response to a phase one pulse $I_1$ in FIG. 5. Naturally, a bubble tends to expand laterally in response. This effect is capitalized upon in expander-detector arrangements. Over another bias range the logic operations described, in connection with FIGS. 14 through 17, occur.

It is to be understood that only portions of a bubble memory need be made in accordance with the teachings herein. Other portions may be structured and operated in a consistent manner herein employing, for example, two apertured electrically-conducting layers for providing a current vector rotating in the plane of the bubble layer or employing a single apertured conducting layer and offset forces.

Although in this application we have only referred to operation using conventional bubble spacings typical of permalloy element systems, the propagation means described herein is also applicable to a bubble lattice configuration. The overall bubble lattice, for example, can be translated using an array of circular holes in each of two offset conductor levels as shown herein. Furthermore, the interactor structure with a single input and a pair of outputs can be used to separate $S=0$ and $S=1$ bubbles as part of the detection process required when the data storage is encoded in these bubble states.

What has been described is considered merely illustrative of the principles of this invention. Accordingly, various embodiments of this invention can be devised by those skilled in the art in accordance with those principles within the spirit and scope of this invention as encompassed by the following claims.

I claim:

1. A magnetic bubble memory comprising a layer of magnetic material in which magnetic bubbles can be moved, and first and second layers of electrically-conducting material adjacent said layer of magnetic material, said first and second layers being separated by an electrically-insulating layer and bearing patterns of apertures, each of said patterns being responsive to a substantially uniform overall current flow therein to produce localized variation therein for generating a pattern of field gradients in said layer of magnetic material, said first and second layers being offset with respect to one another such that the patterns of apertures define a path for magnetic bubbles and operative in response to current pulses impressed alternately in said first and second layers.

2. A magnetic bubble memory in accordance with claim 1 wherein said apertures are generally oval.

3. A magnetic bubble memory in accordance with claim 1 also including means for providing substantially uniform overall current flow in said first and second layers.

4. A propogate arrangement for moving magnetic bubbles along a path in a layer of magnetic material in which magnetic bubbles can be moved, said arrangement comprising first and second layers of electrically conducting material adjacent a surface of said layer of magnetic material, said first and second layers being separated by a layer of electrically insulating material, said first and second layers bearing first and second patterns of apertures respectively, said first and second patterns being offset with respect to one another for defining a path for bubbles in said layer of magnetic material.

5. A propagate arrangement in accordance with claim 4 also including means for impressing substantially uniform current flow alternately in said first and second layers.

6. A magnetic bubble memory (10) comprising a first layer (11) in which magnetic bubbles can be moved and electrical conducting means (25, 26, 70) for moving bubbles in said layer in response to currents impressed therein, said memory being characterized in that said conducting means comprises substantially uniform electrically-conducting first and second layers electrically-isolated from one another and means (70, 100, 101, 103, 87, 25, 26) for impressing substantially uniform overall current flow in said first and second layers, each of said first and second layers including patterns of apertures adapted to locally modify said overall current flow in a manner to generate changing patterns of localized magnetic field gradients in said layer of magnetic material for moving bubbles along a path.

7. A magnetic bubble memory in accordance with claim 6 wherein said first and second layers include like patterns of apertures and the patterns are offset with respect to one another.

8. A magnetic bubble memory in accordance with claim 7 wherein said apertures of said patterns are essentially oval in shape.

* * * * *